(12) United States Patent
Tseng

(10) Patent No.: US 9,946,166 B2
(45) Date of Patent: Apr. 17, 2018

(54) REDUCTION OF HOTSPOTS OF DENSE FEATURES

(71) Applicant: ASML Netherlands B.V., Veldhoven (NL)

(72) Inventor: Shih-En Tseng, Hsinchu (TW)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/308,336

(22) PCT Filed: Apr. 8, 2015

(86) PCT No.: PCT/EP2015/057573
§ 371 (c)(1),
(2) Date: Nov. 1, 2016

(87) PCT Pub. No.: WO2015/165699
PCT Pub. Date: Nov. 5, 2015

(65) Prior Publication Data
US 2017/0052455 A1  Feb. 23, 2017

Related U.S. Application Data

(60) Provisional application No. 61/988,029, filed on May 2, 2014.

(51) Int. Cl.
*G03F 7/20* (2006.01)
(52) U.S. Cl.
CPC .......... *G03F 7/70625* (2013.01); *G03F 7/705* (2013.01); *G03F 7/70125* (2013.01);
(Continued)

(58) Field of Classification Search
CPC .. G03F 7/70125; G03F 7/70258; G03F 7/705; G03F 7/70525; G03F 7/70625; G03F 7/70133
See application file for complete search history.

(56) References Cited

U.S. PATENT DOCUMENTS 7,525,640 B2  4/2009  Jansen et al.
7,587,704 B2  9/2009  Ye et al.
(Continued)

FOREIGN PATENT DOCUMENTS

JP  2007-317847  12/2007

OTHER PUBLICATIONS

International Search Report and Written Opinion dated Jul. 9, 2015 in corresponding International Patent Application No. PCT/EP2015/057573.

*Primary Examiner* — Michelle M Iacoletti
(74) *Attorney, Agent, or Firm* — Pillsbury Winthrop Shaw Pittman, LLP

(57) ABSTRACT

A method to adjust line-width roughness (LWR) in a lithographic apparatus, the method including receiving a value of LWR and/or image log slope (ILS) for each feature of a plurality of different features of a pattern to be imaged, using a patterning device, onto a substrate in a lithographic process, and evaluating a cost function including a lithographic parameter and the values of LWR and/or ILS to determine a value of the lithographic parameter that (i) reduces a bias between the LWR and/or ILS of the different features, or (ii) reduces a difference in the LWR and/or ILS of the different features between different lithographic apparatuses, or (iii) reduces a difference in the LWR and/or ILS of the different features between different patterning devices, or (iv) any combination selected from (i)-(iii).

20 Claims, 10 Drawing Sheets

(52) U.S. Cl.
CPC ...... *G03F 7/70133* (2013.01); *G03F 7/70258* (2013.01); *G03F 7/70525* (2013.01); *G03F 7/70616* (2013.01)

(56)    References Cited

U.S. PATENT DOCUMENTS

| | | |
|---|---|---|
| 7,732,110 B2 | 6/2010 | Finders et al. |
| 9,213,783 B2 | 12/2015 | Hansen |
| 2003/0054642 A1 | 3/2003 | Kagotani et al. |
| 2007/0212617 A1 | 9/2007 | Matsuura |
| 2009/0190115 A1 | 7/2009 | Finders et al. |
| 2012/0052418 A1 | 3/2012 | Tian et al. |
| 2013/0179847 A1 | 7/2013 | Hansen |

REDUCTION OF HOTSPOTS OF DENSE FEATURES

CROSS-REFERENCE TO RELATED APPLICATIONS

This application is the U.S. national phase entry of PCT patent application no. PCT/EP2015/057573, which was filed on Apr. 8, 2015, which claims the benefit of priority of U.S. provisional application Ser. No. 61/988,029, which was filed on May 2, 2014 and which is incorporated herein in its entirety by reference.

FIELD

The present description relates to methods and apparatuses to reduce line-width roughness and hotspots of dense features.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

SUMMARY

In an aspect, there is provided a computer-implemented method to adjust line-width roughness (LWR) in a lithographic apparatus, the method comprising:
receiving a value of LWR and/or image log slope (ILS) for each feature of a plurality of different features of a pattern to be imaged, using a patterning device, onto a substrate in a lithographic process; and
evaluating a cost function comprising a lithographic parameter and the values of LWR and/or ILS to determine a value of the lithographic parameter that (i) reduces a bias between the LWR and/or ILS of the different features, or (ii) reduces a difference in the LWR and/or ILS of the different features between different lithographic apparatuses, or (iii) reduces a difference in the LWR and/or ILS of the different features between different patterning devices, or (iv) any combination selected from (i)-(iii).

In an aspect, there is provided a computer-implemented method to adjust line-width roughness (LWR) in a lithographic system, the method comprising:
receiving an image log slope (ILS) value for a set of different features in a pattern formed by an illumination source; and
tuning a lithographic system parameter to optimize a bias between the ILS values of the different features to reduce LWR.

BRIEF DESCRIPTION OF THE DRAWINGS

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts.

DETAILED DESCRIPTION

Before describing embodiments in detail, it is instructive to present an example environment in which embodiments may be implemented.

Figure 1:
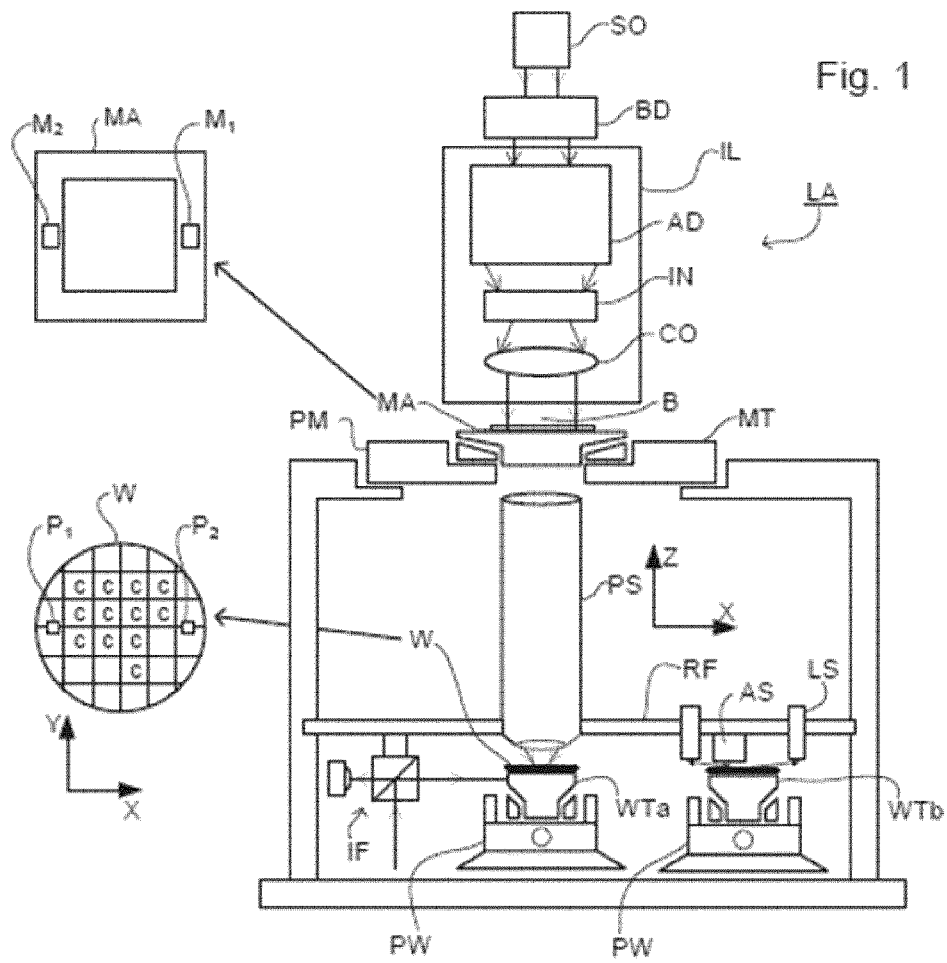
FIG. 1 schematically depicts an embodiment of a lithographic apparatus.

FIG. 1 schematically depicts a lithographic apparatus LA. The apparatus comprises:
an illumination system (illuminator) IL configured to condition a radiation beam B (e.g. DUV radiation or EUV radiation);
a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more tables (e.g., two or more substrate table, two or more patterning device support structures, or a substrate table and metrology table). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WTa may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features.

The depicted apparatus could be used in at least one of the following modes:

1. In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa, WTb (e.g., two substrate tables) and two stations—an exposure station and a measurement station—between which the tables can be exchanged. For example, while a substrate on one table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the exposure station, a second position sensor may be provided to enable the positions of the table to be tracked at both stations. As another example, while a substrate on one table is being exposed at the exposure station, another table without a substrate waits at the measurement station (where optionally measurement activity may occur). This other table has one or more measurement devices and may optionally have other tools (e.g., cleaning apparatus). When the substrate has completed exposure, the table without a substrate moves to the exposure station to perform, e.g., measurements and the table with the substrate moves to a location (e.g., the measurement station) where the substrate is unloaded and another substrate is loaded. These multi-table arrangements enable a substantial increase in the throughput of the apparatus.

Figure 2:
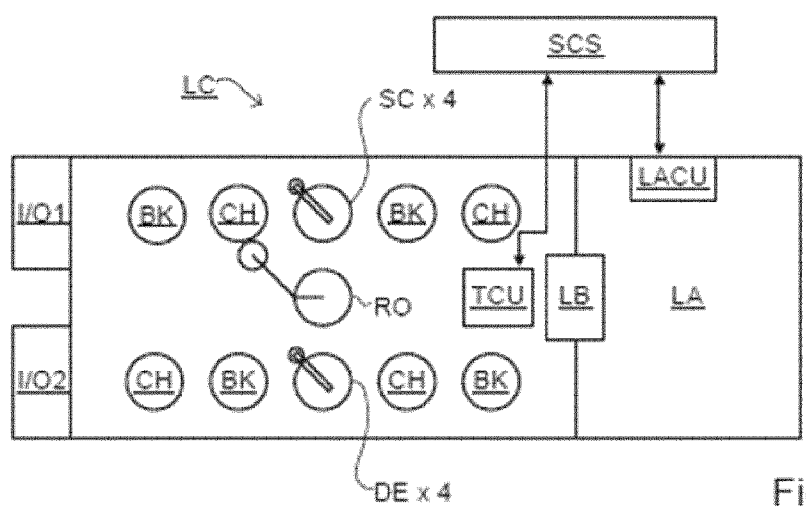
FIG. 2 schematically depicts an embodiment of a lithographic cell or cluster.

As shown in FIG. 2, the lithographic apparatus LA forms part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

Figure 3:
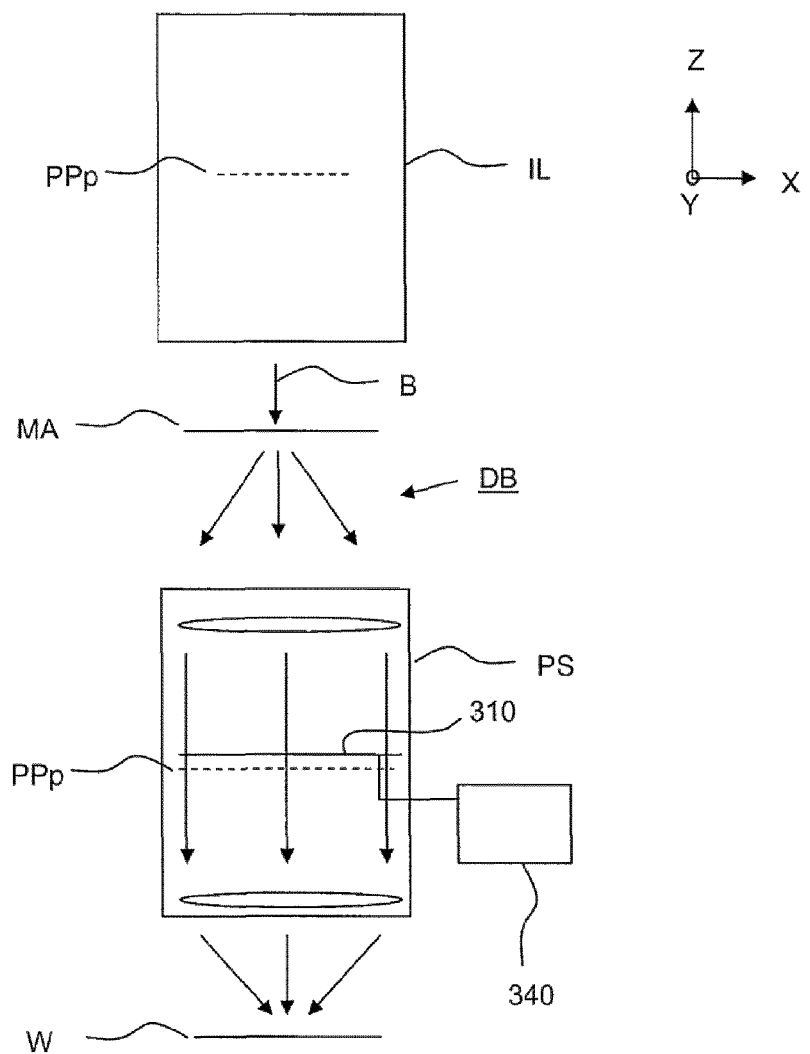
FIG. 3 schematically illustrates a phase adjuster configured to change a phase of an electromagnetic wave traversing a projection system of a lithographic apparatus.

In an embodiment, the optical arrangement of the apparatus of FIG. 1 may use Koehler illumination. Referring to FIG. 3, a pupil plane $PP_i$ in the illumination system IL is conjugate to a pupil plane $PP_p$ of the projection system PS. The pupil plane $PP_p$ is a Fourier transform plane of the object plane in which the patterning device MA is located. An illumination mode of the apparatus can include the distribution of intensity of the radiation of the beam B in the pupil plane $PP_i$ of the illumination system. The distribution of intensity in the pupil plane $PP_p$ of the projection system PS will be substantially the same as the distribution of intensity in the pupil plane $PP_i$ of the illumination system, subject to diffraction effects of the pattern of the patterning device MA. The illumination mode may also describe other features of the illumination such as polarization, intensity, etc.

As the radiation beam traverses through the lithographic apparatus optical system and on to the substrate surface, optical aberrations may distort and/or shift the pattern. While aberrations may be to some extent determined and pre-compensated in the patterning device pattern design, there may be aberration differences during operation of the lithographic apparatus (e.g., due to heating of optical elements in the beam path), between different lithographic apparatuses, etc. For example, the aberrations may vary during a process run and it may not be possible to pre-compensate the patterning device pattern for such aberrations. Accordingly, it is desirable to tune the wavefront of the beam to, for example, correct for pattern distortion and shift and/or focus shift due to such aberrations. But more generally, it is desirable to tune the wavefront of the beam. Such tuning can be used to change the imaging of a patterning device pattern as, for example, discussed herein.

In an embodiment, the lithographic apparatus may comprise a phase adjuster 110 constructed and arranged to adjust a phase of an electric field of an optical radiation beam. In an embodiment, the phase adjuster is located in the projection system.

One method for lens manipulation for tuning the wavefront comprises locally heating portions of an optical element located in the projection system, e.g., close to a pupil plane of the projection system. The optical element may be cooled in parallel to help ensure a consistent control as well as thermal neutrality against surrounding optical elements. This is illustrated in FIGS. 3 and 4.

As schematically shown in FIG. 3, the phase adjuster 110 may comprise an optical element 310 of a material substantially transmissive for radiation of the beam B. In an embodiment, the optical element 310 may be reflective for radiation of the beam 340. The phase adjuster 110 may further comprise a controller 340. An optical path length for a wave traversing the element 310 is adjustable in response to a signal supplied by controller 340. The optical element 310 may be disposed or disposable, for example, substantially in a Fourier Transform plane such as the pupil $PP_p$, and such that—in use—it is traversed by diffracted beams DB emanating from the patterning device. However, optical element 310 may be in a different plane.

Figure 4:
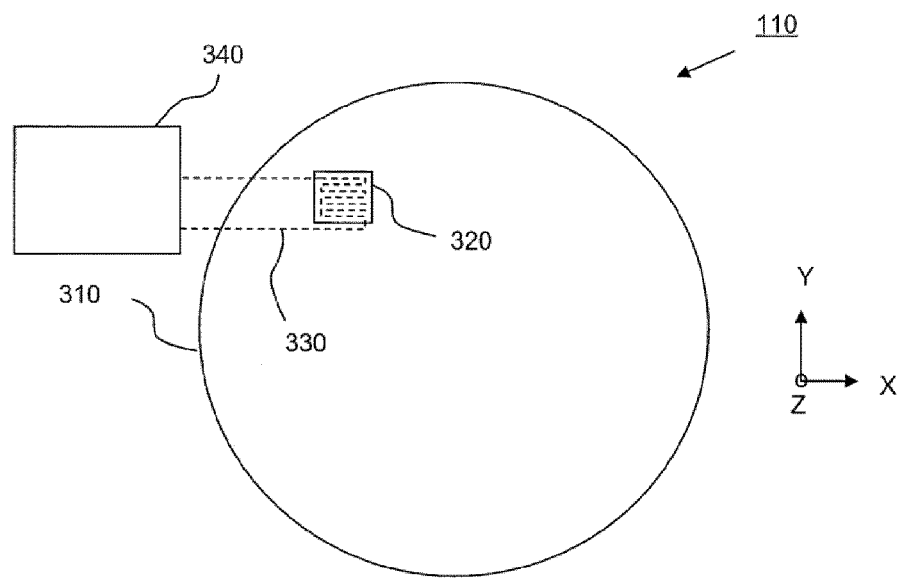
FIG. 4 schematically illustrates an optical element included in the phase adjuster.

FIG. 4 illustrates the phase adjuster 110 in more detail, and shows a top view, along the Z-axis, of the optical element 310. An adjustment of a phase of an optical wave traversing the element 310 may be obtained by applying heat to, or removing heat from, a portion 320 of the optical element 310, thereby introducing a local change of index of refraction of the material of the element relative to the refractive index of the material adjacent to the portion 320. The application of heat can be realized by, for example, transmitting an electrical current through a wire 330 having Ohmic resistance and being arranged in contact with the portion 320 of the element and with the controller 340 arranged to provide the current to the wire 330.

Figure 5:
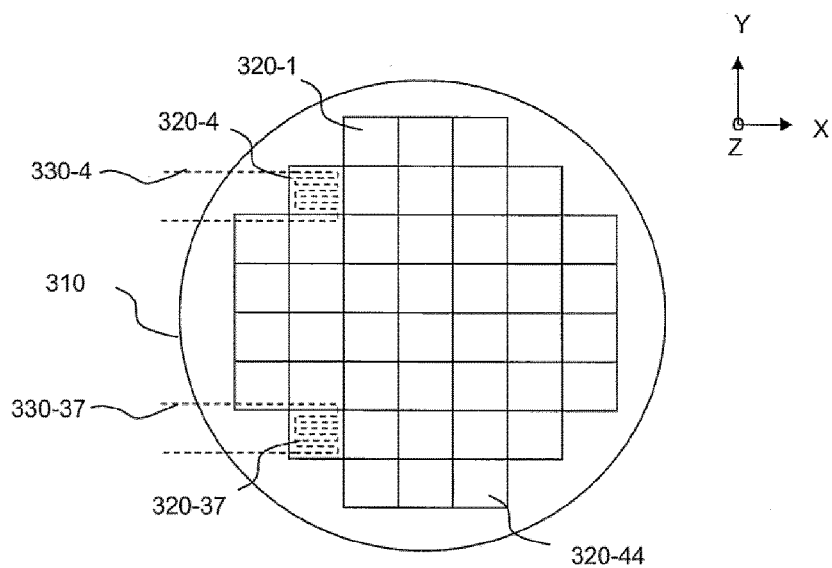
FIG. 5 schematically depicts temperature controllable portions of the optical element included in the phase adjuster.

A plurality of adjacent portions of the optical element may be provided with a corresponding plurality of wires for heating any portion independently from any other portion. For example, as schematically illustrated in FIG. 5, adjacent portions 320-1 up to 320-44 are disposed in adjacent rows and numbered from left to right and from top to bottom. Each portion 320 of the portions 320-1 up to 320-44 is provided with correspondingly numbered heating wires 330-1 up to 330-44 (although FIG. 5, merely for clarity sake, illustrates this only for the portions 320-4 and 320-37). The controller 340 is constructed and arranged such that each wire can be current-activated independently. This enables application of a spatial phase distribution to an optical wave traversing the element 310, in accordance with a spatial distribution of the temperature over the element 310 in the X,Y plane. Accordingly, the wavefront may be manipulated at a high resolution and thus a large range of Zernikes can be created using the phase adjuster (and/or even free form adjustments to a wavefront).

In addition or alternatively, the optical element 310 may include a channel arranged to contain a cooling fluid. The phase adjuster 110 may include a cooling fluid supply and retrieval system connected to the channel and arranged to circulate cooling fluid at a controlled temperature through the channel. Like the wires 330, a cooling channel may be associated with each portion 320; however, alternatively a single cooling channel may be arranged for all portions 320. A cooling of the element 310 in combination with heating a portion 320 of the element 310 may enable adjusting the temperature of the portion 320 within a range of temperatures extending both below and above a nominal temperature. The nominal temperature may, for example, be a specified desired operating temperature of the apparatus 100 or of the material of the optical elements of the projection system PS.

Embodiments of a phase adjuster 110 can be gleaned from U.S. Pat. No. 7,525,640, which is incorporated herein its entirety by reference. The total number of portions 320 is not limited to 44. Instead it may in general depend on a desired spatial resolution of temperature distributions. For example, a ratio of the area of each of the portions 320 to the size of a clear area in the pupil plane $PP_i$ of the projection system PS may be between 100 and 1000.

It is noted that an embodiment of the invention is not limited to the specific embodiment of the phase adjuster described herein. Additional embodiments will be apparent to persons skilled in the relevant art(s) based on the teachings contained herein. For example, in addition or alternatively, a phase adjuster 110 may include an infrared laser arranged to selectively heat portions 320 of an optical element 310 disposed near the pupil $PP_p$. The infrared radiation may be guided to selected portions of the optical element by means of, for example, one or more hollow optical fibers. Details of the infrared laser arrangement for this embodiment can be gleaned from Japanese patent application publication no. JP 2007-317847, incorporated herein its entirety by reference. In the absence of a cooling arrangement, temperatures of different portions 320 can be arranged to mutually differ from each other by supplying corresponding mutually different amounts of infrared radiation energy to the corresponding different portions. A nominal temperature may then be specified as, for example, the average temperature value of the mutually different temperatures. In addition or alternatively, one or more mechanical actuators may be used to adjust one or more optical elements to adjust the phase (e.g., by selectively compressing, and/or selectively expanding, and/or selectively twisting, etc.).

Further, as discussed above, a lithographic apparatus generally includes an illumination system. The illumination system receives radiation from a source, for example a laser, and produces a radiation beam suitable for illuminating a patterning device. Within a typical illumination system, the radiation beam is shaped and controlled such that, at a pupil plane, the radiation beam has a desired spatial intensity distribution. Examples of types of spatial intensity distribution for illumination modes are conventional, dipole, asymmetric, quadrupole, hexapole and annular spatial intensity distribution. The spatial intensity distribution at the pupil plane effectively acts as a secondary radiation source to produce the radiation beam. Following the pupil plane, the radiation is typically focused by an optical element (e.g., lens) group referred to hereafter as "coupling optics". The coupling optics couples the focused radiation into an integrator, such as a quartz rod. The function of the integrator is to improve the homogeneity of the spatial and/or angular intensity distribution of the radiation beam. The spatial intensity distribution at the pupil plane is converted to an angular intensity distribution at the integrator, because the pupil plane substantially coincides with the front focal plane of the coupling optics.

Controlling the spatial intensity distribution at the pupil plane can be done to improve processing latitudes when an image of a patterning device is projected onto a substrate. In particular, dipole, annular or quadrupole off-axis illumination modes may enhance the resolution and/or other parameters of the projection, such as sensitivity to projection system aberrations, exposure latitude and depth of focus.

In an embodiment, the spatial intensity distribution may be created by a spatial radiation modulator in the illumination system. In some embodiments, the spatial radiation modulator may comprise one or more optical elements (e.g., diffractive optical elements) that may be interposed in the beam path singularly or as a combination of two or more optical elements (e.g., via a turret or other handling mechanism). For example, each optical element may be specifically configured for a particular spatial intensity distribution or illumination, such as dipole, annular, etc.

Figure 6:
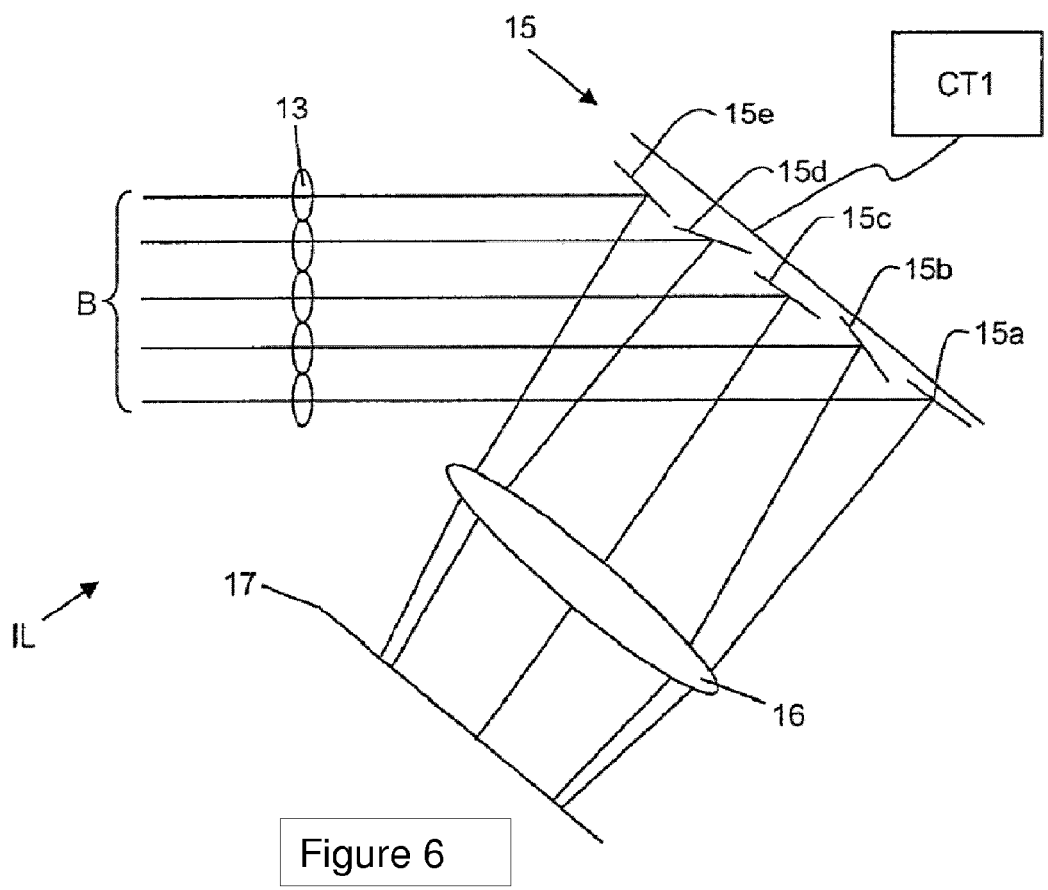
FIG. 6 schematically depicts a spatial radiation modulator comprising a plurality of individually controllable elements.

In an embodiment, the spatial radiation modulator may comprise a plurality of individually controllable elements that may be used to create the spatial intensity distribution. FIG. 6 is a schematic illustration of an apparatus which forms part of the illumination system IL. The apparatus comprises a microlens array 13, an array of individually controllable (reflective) elements 15 (referred to hereafter as mirrors) and optics 16. In operation, the radiation beam B passes through the microlens array 13, which separates the radiation beam into a multiplicity of individually collimated radiation sub-beams, each of which is incident upon a different reflective mirror 15a-e of the array of individually controllable mirrors 15.

FIG. 6 shows a first radiation sub-beam incident at a first mirror 15a. Like the other mirrors 15b-e of the array of individually controllable mirrors 15, the mirror 15a reflects the sub-beam to an intermediate plane 17 via optics 16 (the optics may, for example, comprise a focusing lens). The intermediate plane 17 may be, for example, a pupil plane of the illumination system, which acts as a secondary radiation source of the lithographic apparatus. The other mirrors 15b-e reflect the other sub-beams to other areas of the plane 17 via the re-directing optics 16. By adjusting the orientations of the mirrors 15a-e and thus determining the locations in the plane 17 at which the sub-beams are incident, almost any spatial intensity distribution in the plane 17 can be produced. Thus, almost any spatial intensity distribution may be formed, thereby providing an improvement of process latitudes of the lithographic apparatus. A controller CT1 may be used to control the orientations of the mirrors 15a-e.

Although the array of individually controllable mirrors 15 is shown in FIG. 6 as five mirrors 15a-e, in practice a significantly larger number of mirrors may be provided in the array. The array of individually controllable mirrors 15 may, for example, comprise a two-dimensional array. The array of mirrors 15 may, for example, comprise 100 or more mirrors, and may, for example, comprise 1000 or more mirrors. The array of mirrors 15 may be rectangular.

The microlens array 13 may be configured such that a different microlens is associated with each mirror of the array of individually controllable mirrors 15. The microlens array 13 may, for example, comprise a two-dimensional array. The microlens array 13 may, for example, comprise 100 or more microlenses, and may, for example, comprise 1000 or more microlenses. The microlens array may be rectangular.

While particular shapes of spatial intensity distribution have been described, the spatial intensity distribution may in general be of freeform. In freeform illumination, there is essentially unlimited freedom in intensity and position of the radiation in the illumination pupil. The spatial radiation modulator may be able to generate numerous, or any, freeform illumination pupil shape. Such freeform illumination may be useful in conjunction with illumination and patterning device pattern optimization to obtain the appropriate device design pattern on the substrate surface.

To enable production of smaller and smaller features, sophisticated fine-tuning steps may be applied to the lithographic projection apparatus, manufacturing process and/or design layout. These include, for example, but not limited to, optimization of numerical aperture and optical coherence settings, customized illumination modes, wavefront customization, use of phase shifting patterning devices, optical proximity correction (OPC), sometimes also referred to as "optical and process correction") in the design layout, or other methods generally defined as "resolution enhancement techniques" (RET).

As an example, OPC addresses the fact that the final size and placement of an image of the design layout projected on the substrate will not be identical to, or simply depend only on the size and placement of the design layout on the patterning device. A person skilled in the art will recognize that, especially in the context of lithography simulation/optimization, the term "mask," "patterning device" and "design layout" can be used interchangeably, as in lithography simulation/optimization, a physical patterning device is not necessarily used but a design layout can be used to represent a physical patterning device. For the small feature sizes and high feature densities present on some design layouts, the position of a particular edge of a given feature may be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the design layout is in accordance with requirements of a given target circuit design, proximity effects may need to be predicted and compensated for, using sophisticated numerical models, corrections or pre-distortions of the design layout. These modifications may include shifting or biasing of edge positions or line widths, adjustment of the global bias of the design layout, application of "assist" features that are intended to assist projection of other features, etc. The effect of OPC, e.g., design layouts after application of OPC and any other RET, are verified by design inspection, i.e. intensive full-chip simulation using calibrated numerical process models, in order to minimize the possibility of design flaws being built into the patterning device pattern. Both OPC and full-chip RET verification may be based on numerical modeling systems and methods.

In addition or alternatively to optimization of design layouts or patterning devices (e.g., OPC), the illumination mode can also be optimized, either jointly with patterning device optimization or separately, in an effort to improve the overall lithography fidelity. That is, the spatial intensity distribution type (e.g., annular, quadrupole, dipole, etc.), the spatial intensity distribution characteristics (e.g., sigma setting (e.g., $\sigma$ for a conventional circular illumination pattern, outer $\sigma_r$ and inner $\sigma_c$ for annular illumination, various $\sigma$ settings and a pole angle $\alpha$ defining the angle subtended by one or more of the poles between the selected inner and outer radii)) and other illumination mode settings may be optimize with the design layout to, for example, achieve an optimal balance between finer resolution and reduced radiation intensity. Variation in illumination configurations can be used to provide improvements in resolution, depth of focus, contrast and other characteristics of the printed image. However, each illumination type has certain tradeoffs. For example, improved contrast may come at the expense of depth of focus.

In an embodiment, optimization of both the illumination mode and design layout is useful to ensure a viable process window for projection of critical circuit patterns. As an example of such optimization, the illumination may be partitioned into several regions, each of which corresponds to a certain region of the pupil spectrum. Then, the illumination distribution is assumed to be uniform in each region and the brightness of each region is optimized for process window. In another example, based on illumination pixels, the illumination optimization problem is converted into a series of non-negative least square optimizations. In another example, it is possible to discretize illumination into independent illumination points and the design layout into diffraction orders in the spatial frequency domain, and separately formulate a cost function (which is defined as a function of selected design variables) based on process window metrics such as exposure latitude which could be predicted by optical imaging models from illumination point intensities and design layout diffraction orders. The term "design variables" comprises a set of parameters of a lithographic projection apparatus and process, for example, parameters a user of the lithographic projection apparatus can adjust. It should be appreciated that any characteristics of a lithographic apparatus or process, including those of the illumination, the patterning device, the projection optics, and/or resist characteristics can be among the design variables in the optimization. The cost function is often a non-linear function of the design variables. Then standard optimization techniques may be used to minimize the cost function.

In addition or alternatively to optimization of a design layout and/or illumination mode, it will be appreciated that other design variables may be optimized. For example, the wavefront in the projection system and/or one or more post-exposure variables (e.g., etch, bake, etc.) may be optimized on their own or in conjunction with the design layout, the illumination mode or other design variable.

Figure 7:
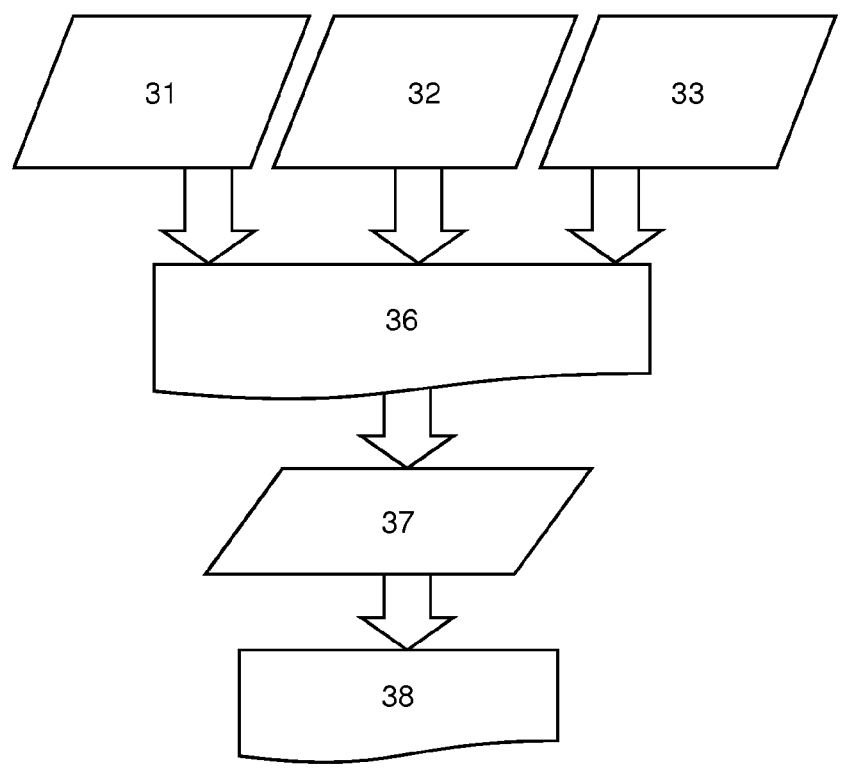
FIG. 7 is an exemplary block diagram of simulation models.

An exemplary flow chart for simulating lithography in a lithographic projection apparatus is illustrated in FIG. 7. An illumination model 31 represents optical characteristics (including radiation intensity distribution and/or phase distribution) of the illumination. The illumination model 31 can represent optical characteristics of the illumination such as, but not limited to, the numerical aperture settings, sigma ($\sigma$) settings, particular illumination shape (e.g. off-axis illumination shapes such as annular, quadrupole, dipole, etc.), etc.

A projection optics model 32 represents optical characteristics (including changes to the radiation intensity distribution and/or the phase distribution caused by the projection optics) of the projection optics. The projection optics model 32 can represent optical characteristics of the projection optics such as aberration, distortion, refractive indexes, physical sizes, physical dimensions, absorption, etc. The projection optics model 32 may include aberration caused by various factors, for example, heating of the components of the projection optics, stress caused by mechanical connections of the components of the projection optics, etc. The illumination model 31 and the projection optics model 32 can be combined into a transmission cross coefficient (TCC) model.

A design layout model 33 represents optical characteristics (including changes to the radiation intensity distribution and/or the phase distribution caused by a given design layout) of a design layout, which is the representation of an arrangement of features of a patterning device. The design layout model 33 may capture how the device design features are laid out in the pattern of the patterning device and may include a representation of physical properties of a physical patterning device, as described, for example, in U.S. Pat. No. 7,587,704, which is incorporated by reference in its entirety.

An aerial image 36 can be simulated from the illumination model 31, the projection optics model 32 and the design layout model 33; an aerial image (AI) is the radiation intensity distribution on the substrate. Optical properties of the lithographic projection apparatus (e.g., properties of the illumination, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the illumination and the projection optics.

A resist layer on the substrate is exposed and the aerial image is transferred to the resist layer as a latent "resist image" (RI) therein. The resist image (RI) can be defined as a spatial distribution of solubility of the resist in the resist layer. The resist image 38 can be simulated from the aerial image 36 using a resist model 37. The resist model can be used to calculate the resist image from the aerial image. The resist model is typically related only to properties of the resist layer (e.g., effects of chemical processes which occur during exposure, post-exposure bake (PEB), development, etc.). Simulation of lithography can, for example, predict contours and CDs in the resist image.

The objective of the simulation is to accurately predict, for example, edge placements and critical dimensions (CDs), which can then be compared against an intended design. The intended design is generally defined as a pre-OPC design layout, and can be provided in a standardized digital file format such as GDSII or OASIS or other file format.

Figure 8:
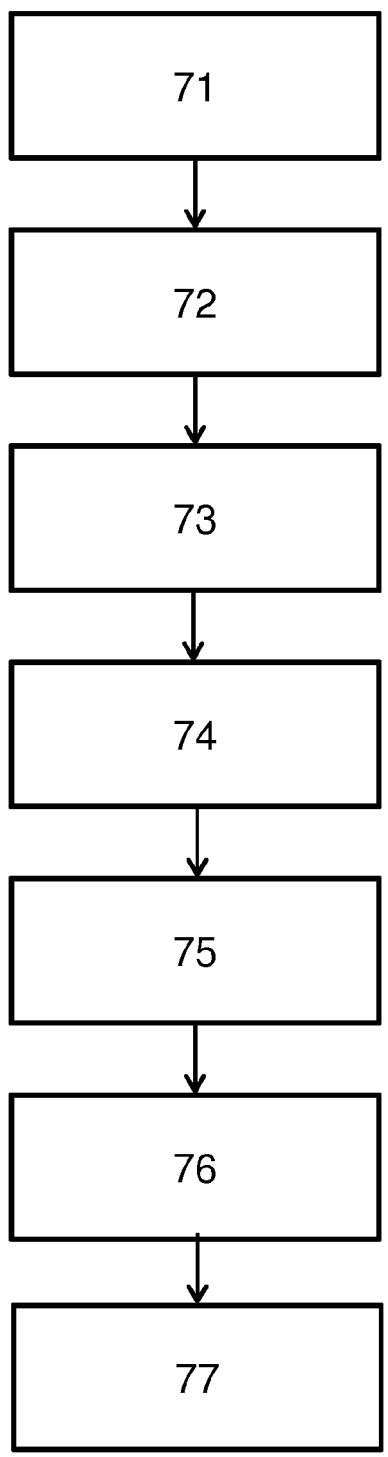
FIG. 8 is an exemplary block diagram illustrating the functional modules of a lithographic simulation model.

This system (e.g., software and/or hardware) may be further expanded or generalized to simulate a manufacturing process involving lithography of a patterning device pattern. The major manufacturing system components and/or processes can be described by various functional modules, for example, as illustrated in FIG. 8. Referring to FIG. 8, the functional modules may include a design layout module 71, which defines a microelectronic device (or other) design pattern; a patterning device layout module 72, which defines how the patterning device pattern is laid out in polygons based on the device design; a patterning device model module 73, which models the physical properties of the pixilated and continuous-tone patterning device to be utilized during the simulation process; an optical model module 74, which defines the performance of the optical components of the lithography system; a resist model module 75, which defines the performance of the resist being utilized in the given process; and a process model module 76, which defines performance of the post-resist development processes (e.g., etch). The results of one or more of the simulation modules, for example, predicted contours, critical dimensions, line width roughness, etc., are provided in a result module 77.

The properties of the illumination and projection optics are captured in the optical model module 74 (akin to the illumination model 31, the projection optics model 32 and the design layout model 33). As discussed above, the properties may include, but is not limited to, numerical aperture and/or sigma (σ) settings as well as any particular illumination shape, where σ (or sigma) is outer radial extent of the spatial intensity distribution. The optical properties of the photo-resist layer coated on a substrate—i.e. refractive index, film thickness, propagation and polarization effects—may also be captured as part of the optical model module 74, whereas the resist model module 75 (akin to resist model 37) may describe the effects of chemical processes which occur during resist exposure, post exposure bake (PEB) and development, in order to predict, for example, contours of resist features formed on the substrate.

In general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of photons, which is further modified by diffusion processes and various loading effects. Efficient simulation methods that are fast enough for full-chip applications approximate the realistic 3-dimensional intensity distribution in the resist stack by a 2-dimensional aerial (and resist) image.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process. However, sometimes the model parameters may be inaccurate from measurement and reading errors, and there may be other imperfections in the system. With precise calibration of the model parameters, extremely accurate simulations can be done.

In an optimization, a figure of merit of a system (e.g., a manufacturing process and/or lithographic apparatus) can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations. The term "evaluation points" herein should be interpreted broadly to include any characteristics of the system. The design variables of the system can be confined to finite ranges and/or be interdependent due to practicalities of implementations of the system. In case of a lithographic projection apparatus, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

In one or more embodiments, optimization can be performed using a cost function, such as:

$$CF(z_1,z_2,\ldots z_N)=\sum_{p=1}^{P} w_p f_p^2(z_1,z_2,\ldots z_N) \quad \text{(Eq. 1)}$$

wherein $(z_1, z_2, \ldots, z_N)$ are N design variables or values thereof; $f_p(z_1, z_2, \ldots, z_N)$ may be a function of a difference between an actual value and an intended value of a characteristic at the p-th evaluation point for a set of values of the design variables of $(z_1, z_2, \ldots, z_N)$. $w_p$ is a weight constant assigned to the p-th evaluation point. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the substrate, or any point on a design layout, or resist image, or aerial image. It should be noted that the normal weighted root mean square (RMS) of $f_p$ ($z_1$, $z_2$, ..., $z_N$) is defined as $$\sqrt{\frac{1}{P}\sum_{p=1}^{P} w_p f_p^2(z_1, z_2, \ldots, z_N)},$$

therefore, minimizing the weighted RMS of $f_p$ ($z_1$, $z_2$, ..., $z_N$) is equivalent to minimizing the cost function CF ($z_1$, $z_2$, ..., $z_N$)=$\sum_{p=1}^{P} w_p f_p^2$ ($z_1$, $z_2$, ..., $z_N$), defined in Eq. 1.

The cost function may represent any suitable characteristics, for instance, focus, critical dimension, image log slope, critical dimension, image shift, image distortion, image rotation, etc. For example, the cost function may be a function of one or more selected from the following lithographic metrics: edge placement error, critical dimension, resist contour distance, worst defect size, image log slope, line width roughness, stochastic effect, three-dimensional effect of the patterning device, three-dimensional effect of the resist, best focus shift, pupil fill factor, exposure time, and throughput. Since it is the resist image that often dictates the circuit pattern on a substrate, the cost function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). The design variables can be any adjustable parameters such as adjustable parameters of the illumination, the patterning device, the projection optics, dose, focus, etc.

Further, if a process window (PW) is maximized, it is possible to consider the same physical location from different PW conditions as different evaluation points in the cost function in (Eq. 1). For example, if N PW conditions are considered, then the evaluation points can be categorized according to their PW conditions and the cost functions can be written as:

$$CF(z_1,z_2,\ldots,z_N)=\sum_{p=1}^{P} w_p f_p^2(z_1,z_2,\ldots z_N)=\sum_{u=1}^{U}\sum_{p_u=1}^{P_u} w_{p_u} f_{p_u}^2(z_1,z_2,\ldots z_N) \quad \text{(Eq. 2)}$$

where $f_{p_u}(z_1, z_2, \ldots, z_N)$ is a function of the difference between an actual value and an intended value of the $p_i$-th evaluation point for a set of values of the design variables of $(z_1, z_2, \ldots, z_N)$ under the u-th PW condition u=1, ..., U. When this difference is the edge placement error (EPE), then minimizing the above cost function is equivalent to minimizing the edge shift under various PW conditions, thus this leads to maximizing the PW. In particular, if the PW also consists of different patterning device bias, then minimizing the above cost function also includes the minimization of MEEF (Mask Error Enhancement Factor), which is defined as the ratio between the substrate EPE and the induced patterning device pattern edge bias.

The design variables or functions thereof may have constraints, which can be expressed as $(z_1, z_2, \ldots, z_N) \in Z$, where Z is a set of possible values of the design variables. The constraints may represent physical restrictions in a hardware implementation of the lithographic projection apparatus. The constraints may include one or more of: tuning ranges, rules governing patterning device manufacturability, and interdependence between the design variables. The optimization process therefore is to find a set of values of the design variables, under the constraints $(z_1, z_2, \ldots, z_N) \in Z$, that minimize the cost function, i.e., to find $$(\tilde{z}_1, \tilde{z}_2, \ldots \tilde{z}_N) = \arg\min_{(z_1, z_2, \ldots, z_N) \in Z} CF(z_1, z_2, \ldots z_N) = \arg\min_{(z_1, z_2, \ldots, z_N) \in Z} \sum_{p=1}^{P} w_p f_p^2 \quad \text{(Eq. 3)}$$

Figure 9:
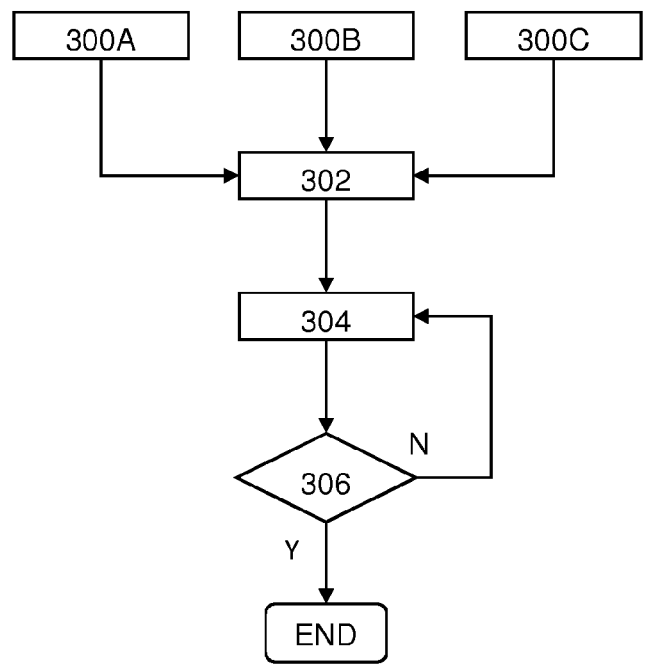
FIG. 9 shows a flow chart of a general method of optimizing a manufacturing process involving a lithography apparatus.

A general method of optimization, according to an embodiment, is illustrated in FIG. 9. This method comprises a step 302 of defining a multi-variable cost function of a plurality of design variables. The design variables may comprise any suitable combination selected from one or more characteristics of the illumination (300A) (e.g., spatial intensity distribution type, spatial intensity distribution characteristics, pupil fill ratio (percentage of radiation of the illumination that passes through a pupil or aperture), etc.), one or more characteristics of the projection optics (300B) and/or one or more characteristics of the design layout (300C). For example, the design variables may include a characteristic of the illumination (300A) and a characteristic of the design layout (300C) (e.g., global bias, CD, etc.) but not a characteristic of the projection optics (300B), which leads to a "source mask optimization" (SMO). Alternatively, the design variables may include a characteristic of the illumination (300A), a characteristic of the projection optics (300B) and a characteristic of the design layout (300C), which leads to a "source-mask-lens optimization" (SMLO). In step 304, the applicable design variables are simultaneously adjusted so that the cost function is moved towards convergence. In step 306, it is determined whether a predefined termination condition is satisfied. The predetermined termination condition may include various possibilities, i.e. the cost function may be minimized or maximized, as required by the numerical technique used, the value of the cost function has been equal to a threshold value or has crossed the threshold value, the value of the cost function has reached within a preset error limit, or a preset number of iterations is reached. If either of the conditions in step 306 is satisfied, the method ends. If none of the conditions in step 306 is satisfied, the step 304 and 306 are iteratively repeated until a desired result is obtained. The optimization does not necessarily lead to a single set of values for the design variables because there may be physical restraints caused by factors such as the pupil fill factor, the resist chemistry, the throughput, etc. The optimization may provide multiple sets of values for the design variables and associated performance characteristics (e.g., the throughput) and allows a user of the lithographic apparatus to pick one or more sets.

In an embodiment, instead of, or in addition to, calculating and/or determining the effect on an optical characteristic of the projection optics and/or of the illumination, it is envisioned that an adjustable optical characteristic of the projection optics and/or illumination can be included in the design variables. Exemplary adjustable optical characteristics may include a phase adjuster, a spatial intensity modulator, the temperature data or signal associated with temperature data of one or more devices, e.g. heaters, utilized to control the temperature of an optical element of the projection system, a Zernike coefficient, etc. The optimization procedure can then be carried out and the design variables, including the adjustable optical characteristics, can be simultaneously adjusted so that the cost function is moved towards convergence.

Figure 10:
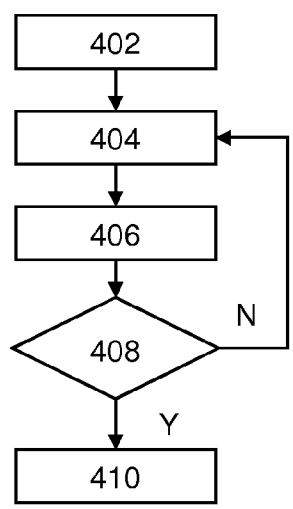
FIG. 10 shows a flow chart of a method of optimizing a manufacturing process where the optimization of all the design variables is executed alternately.

In FIG. 9, the optimization of all the design variables is executed simultaneously. Such flow may be called simultaneous optimization, joint optimization, or co-optimization. The terms "simultaneous", "simultaneously", "joint" and "jointly" as used herein mean that the design variables of the characteristics of the illumination, patterning device, projection optics and/or any other design variables, are allowed to change at the same time. Alternatively, the optimization of all the design variables may be executed alternately, as illustrated in FIG. 10. In this flow, in each step, some design variables are fixed while the other design variables are optimized to minimize the cost function; then in the next step, a different set of variables are fixed while the others are optimized to minimize the cost function. These steps are executed alternately until convergence or certain terminating conditions are met. As shown in the non-limiting example flowchart of FIG. 10, first, a design layout (step 402) is obtained, then a step of illumination optimization is executed in step 404, where all the design variables of the illumination are optimized ("source optimization" (SO)) to minimize the cost function while all the other design variables are fixed. Then in the next step 406, a patterning device optimization ("mask optimization" (MO)) is performed, where all the design variables of the patterning device are optimized to minimize the cost function while all the other design variables are fixed. These two steps are executed alternately, until certain terminating conditions are met in step 408. Various termination conditions can be used, such as, the value of the cost function becomes equal to a threshold value, the value of the cost function crosses the threshold value, the value of the cost function reaches within a preset error limit, or a preset number of iterations is reached, etc. Note that SO-MO alternate optimization is used as an example for the alternate flow. The alternate flow can take many different forms, such as SO-LO-MO alternate optimization, where SO, LO ("lens optimization" involving projection optics optimization) is executed, and MO alternately and iteratively; or first SMO can be executed once, then execute LO and MO alternately and iteratively; and so on. Finally the output of the optimization result is obtained in step 410, and the process stops.

The pattern selection algorithm, as discussed before, may be integrated with the simultaneous or alternate optimization. For example, when an alternate optimization is adopted, first a full-chip SO can be performed, the 'hot spots' and/or 'warm spots' are identified, then an MO is performed. In view of the present disclosure numerous permutations and combinations of sub-optimizations are possible in order to achieve the desired optimization results.

As discussed above, the lithographic apparatus may include a component called a "wavefront manipulator" (e.g., phase adjuster 110 and/or the spatial radiation modulator of the illumination system) that can be used to adjust the shape of a wavefront and intensity distribution and/or phase shift of the radiation beam. The wavefront manipulator can adjust a wavefront and intensity distribution at any location along an optical path of the lithographic apparatus, such as before the patterning device, near a pupil plane, near an image plane, or near a focal plane. The wavefront manipulator can be used to correct or compensate for certain distortions of the wavefront and intensity distribution caused by, for example, the illumination, the patterning device, temperature variation in the lithographic apparatus, and/or thermal expansion of components of the lithographic apparatus. Adjusting the wavefront and intensity distribution can change values of the evaluation points and the cost function. Such changes can be simulated from a model or actually measured.

As discussed above, the projected patterning device pattern image is a distribution of radiation intensity as a function of spatial position in the image plane, and is the source of information that is exposed into the resist. Thus, it is desirable for the projection system to generate a high quality image. One parameter that can be used to measure the quality of an image projected by the projection system is image slope (IS) which is the slope of the image intensity near a nominal line edge within the image. This measure is intensity dependent; for example, if the intensity is doubled, the IS doubles. Dividing IS by intensity can normalize this effect. The resulting metric is called the image log-slope (ILS):

$$ILS = \frac{1}{I}\frac{dI}{dx} = \frac{d\ln(I)}{dx} \quad \text{(Eq. 4)}$$

where this log-slope is measured at the nominal line edge, I being the intensity as a function of x. ILS can, obviously, be calculated for x and/or y dimensions for a particular image. Further, variations in the resist edge positions (linewidths) may be expressed as a percentage of the nominal linewidth. Accordingly, the position coordinate x can also be normalized by multiplying the log-slope by the nominal linewidth w, to give the normalized image log-slope (NILS).

$$NILS = w\frac{d\ln(I)}{dx} \quad \text{(Eq. 5)}$$

The discussion herein will focus on ILS. ILS should be understood as including NILS or any other variant based on ILS, unless the discussion is specifically focused on distinguishing the general meaning of ILS from its variant.

Figure 11:
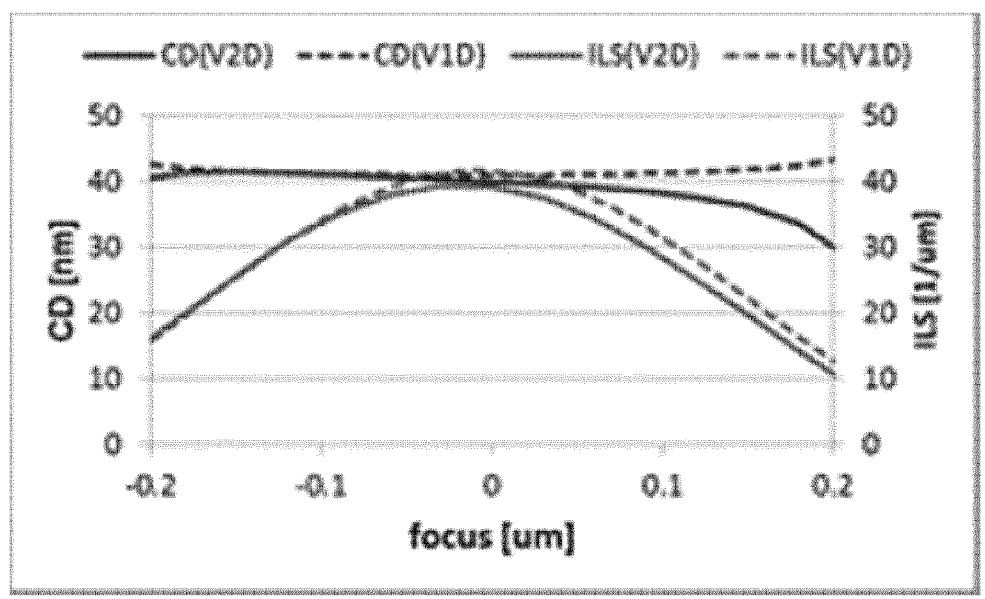
FIG. 11 schematically depicts a graph of image log-slope and CD as a function of focus for dense features.

For a particular image, if a line is not "sharp", ILS will have a relatively smaller value since the intensity across the line edge does not change "rapidly". In such instances, line-width of a particular line may vary from its nominal value. The variability in line-width is measured by line-width roughness (LWR), i.e., LWR is a measure of a feature line width from a nominal linewidth. Thus, it can be seen that as LWR decreases, ILS increases and vice versa (LWR and ILS may not always vary in proportion to each other). The typical imaging behavior of dense features of a patterning device pattern is the generally insensitive CD response through focus, as shown in FIG. 11. However, as shown in FIG. 11, the ILS may see significant change over the same focus range. Further, small ILS will cause large LWR along lines. So to minimize LWR, ILS should be maximized.

It has been discovered that, for a particular focus, there may be a difference in LWR between different dense features even though the CD for the features is substantially the same. In particular, horizontal dense features and vertical dense features (where horizontal and vertical in this instance refer to a same plane as conventionally understood in imaging of patterning device patterns) may have different LWR even though the CD for the horizontal and vertical features is substantially the same. Thus, horizontal lines and vertical lines of identical pitch and patterning device pattern CD may have different contrast (ILS) and different LWR. Thus, different dense structures (e.g., horizontal and vertical dense lines) with equal average CD may suffer from different LWR due to different ILS. The term "dense" is relative to "isolated". So, for example, for periodic 1D lines and spaces, assuming L to be the line width and S to be space between lines, features with L/S ratio=1:2, 1:1.5, 1:1 or less (e.g., 1.25:1, 1.5:1, 2:1, 2.5:1, 3:1, 4:1, etc.) can be considered as dense versus isolated features with, for example, L/S=1:5. In other words, when a feature size is comparable to a space (separation) between adjacent features, the features are regarded as dense. As the separation increases, the feature becomes more isolated.

A difference in characteristics for horizontal dense features and vertical features is known as horizontal-vertical (HV) bias. HV bias generally can cause distortion in the image on the substrate, causing unacceptable device failures and adversely affecting process yields. Further, too much LWR or ILS bias (e.g., LWR or ILS HV bias) may cause hotspots such as line pinching and impact electrical yield. Thus, this LWR or ILS bias may be a significant problem for low k1 imaging. Even though there may not be an observable CD difference between different (e.g., vertical and horizontal) dense features, there may be a LWR or ILS bias between both features, which in turn can lead to substrate acceptance test failure for an imaged substrate.

The variability in line-width/ILS in an image (e.g., the LWR or ILS bias) can arise from a variety of sources. For example, variation in the illumination mode (e.g., change in wavelength, variation in the illumination spatial intensity distribution, and so forth), variation in focus of the projection system, optical aberration in one or more components of the projection system, variation in the Jones pupil and so forth. For instance, an illumination mode may vary from one lithographic apparatus to another even for the same target illumination mode specification. As another example, projection system aberrations are also lithographic apparatus dependent even when the aberrations stay within a defined specification.

In particular, for dense features, the illumination mode and projection system aberration may be the main contributors to the LWR or ILS bias even though little CD difference was observed between the different dense features (e.g., horizontal lines and vertical lines). Variation in the illumination mode may cause more degradation of LWR or ILS for horizontal dense features than for vertical dense features. Projection system aberration may, in some cases, contribute to the LWR or ILS bias and in other cases, have substantially no contribution to the LWR or ILS bias. Generally, the contribution to LWR or ILS bias by the illumination mode is greater than that of projection system aberration. Further, the Jones pupil may be a contributor to the LWR or ILS bias. Variation in the Jones pupil mode may cause more degradation of LWR or ILS for vertical dense features than for horizontal dense features. Thus, the LWR or ILS bias may be compensated by adjusting the illumination mode and/or compensating for projection system aberration and/or compensating for variation in the Jones pupil.

Thus, in an embodiment, one or more parameters of the lithographic apparatus may be adjusted to compensate for the LWR or ILS bias. In an embodiment, the illumination mode may be adjusted by adjusting a parameter of the illumination system (including optionally the radiation source). For example, the spatial radiation modulator of the illumination system described herein may be used to adjust the illumination mode, for example, changing a characteristic of the spatial intensity distribution, to reduce the LWR or ILS bias.

Figure 12:
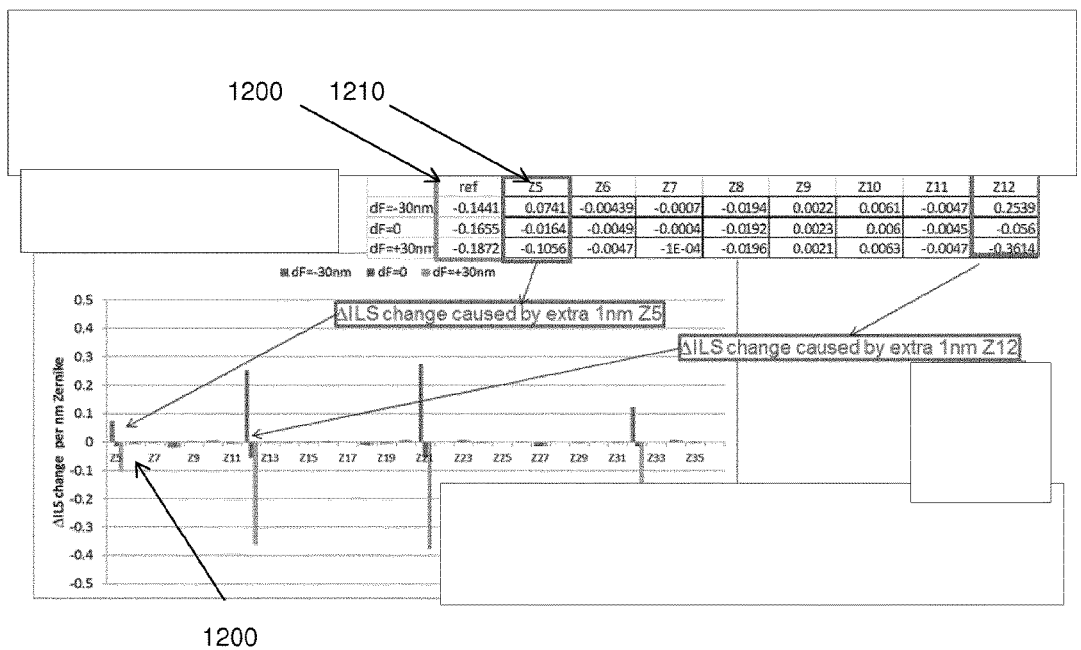
FIG. 12 depicts simulated ILS bias for horizontal and vertical dense features for individual Zernike at best focus (dF=0) and at defocus (dF=+/−30 nm)

In an embodiment, the wavefront of the radiation may be adjusted. For example, a phase adjuster as described herein may be used to change a characteristic of the wavefront to reduce the LWR or ILS bias by, for example, compensating for projection system aberration. Referring to FIG. 12, simulated ILS bias of horizontal and vertical dense features over individual Zernikes at best focus (dF=0) and at defocus (dF=+/−30 nm) is depicted. As shown in FIG. 12, at the reference condition (nominal illumination mode and nominal projection system aberration plus dynamics), there is an ILS HV bias as shown at 1200. This ILS HV bias is primarily caused by illumination mode error. Further, FIG. 12 shows, at 1210, that ILS HV bias is sensitive to 2θ astigmatism (Z5) and is magnified through focus. Thus, an effective correction may be application of a 2θ astigmatism (Z5) to the wavefront. As can be seen, correction using one or more additional or alternative Zernikes is possible (e.g., Z12, Z21 and Z32). However, as can be seen in FIG. 12, the effect on ILS can be quite different at defocus compared to at focus. Accordingly, use of such Zernikes may not be as effective because of the significant effect if there is defocus.

In an embodiment, the focus value at which the substrate is imaged may be adjusted. For example, the position of the substrate relative to a relatively fixed focus point of the projection system may be adjusted, the focus point of the projection system may be moved, the wavefront altered to affect at what focus the pattern is being imaged, etc. For example, if a wavefront correction is applied, the substrate may be imaged at a particular defocus to obtain a particular difference change in ILS to reduce the ILS HV bias. For example, as shown in FIG. 12, Zernike Z5 has a different change in ILS at different focus values. So, for example, where a 2θ astigmatism (Z5) correction is applied, the substrate may be imaged at particular defocus amount to take advantage of the different change in ILS at that defocus for a 2θ astigmatism correction.

In an embodiment, considering that the LWR or ILS bias caused by the illumination mode is usually larger than the LWR or ILS bias which could be changed by a Zernike (i.e., by wavefront modification), it is proposed to adjust the illumination mode, using, for example, the spatial radiation modulator of the illumination system, to minimize pupil error. Then, further correction can be applied by altering the wavefront (e.g., as discussed above, apply 2θ astigmatism via a phase adjuster) and/or magnifying the effect through fine tuning of focus. Using illumination mode and/or wavefront modification the LWR or ILS bias of dense features may be corrected without significantly impacting their CD and/or process window performance.

While illumination mode, wavefront and/or focus modification have been described, it will be appreciated that one or more additional or alternative parameters of a lithographic apparatus may be modified to correct the LWR or ILS bias. For example, where appropiate, dose, wavelength, numerical aperture (NA), dynamics, etc. may be parameters that may be considered and adjusted.

To arrive at the appropriate modification of the illumination mode, wavefront, focus and/or other lithographic apparatus or process parameter, a simulation may be performed. Accordingly, in the simulation, ILS or LWR may be included in the cost function of the optimization algorithm to enable LWR control of dense features. For example, the cost function may minimize the LWR or ILS bias of dense features. As another example, the cost function may perform a matching function, that is minimize the difference between LWR or ILS biases of various sets of dense features, e.g., in the same pattern, on different patterning devices, as used in different lithographic apparatuses, etc. The cost function may be applied for particular identified features (sometimes referred to as critical features or hot spots), which may be identified by a user or identified by the system.

Of course, one or more lithographic apparatus or process parameters (e.g., illumination mode, wavefront, focus, etc.) are varied as part of the simulation to arrive at, for example, an optimal set of values for the one or more parameters. Besides ILS, the cost function may include other measures such as CD. So, for example, a CD difference for particular features of the pattern from a target may be minimized in conjunction with the optimization of the LWR or ILS bias. Thus, ILS can be included as part of the cost function that minimizes CD difference from target in order to match CD and LWR simultaneously or sequentially. Examples of cost functions and optimization techniques are described herein.

As an example, the ASML Pattern Matcher system (hardware and/or software) uses a set of lithographic apparatus parameters to minimize the CD deviation from target for critical features, which critical features may be identified by the user and/or may be identified by the system itself. For example, the system may minimize the CD difference of critical structures within the pattern. For example, the system may minimize the CD difference of critical structures between lithographic apparatuses, i.e., matching. Such a system may be extended by including ILS or LWR in its optimization algorithm to control LWR.

The resulting parameter values may then be provided to the appropriate control system (e.g., as a signal appropriate to the appropriate control system) to enable the particular parameter to be adjusted by the applicable component of the lithographic apparatus (e.g., the phase adjuster, the spatial radiation modulator, etc.)

Accordingly, in an embodiment, a simulation may include a method of reducing or matching LWR by controlling one or more parameters of a manufacturing system. For example, in an embodiment, the method may include receiving or determining ILS for a set of features in a pattern at each of a plurality of evaluation points selected in an image plane, determining a bias function of the ILS based on a difference between ILS for a set of horizontal features in the pattern and ILS for a set of vertical features in the pattern, and tuning a lithographic parameter to optimize the bias function while reducing the LWR. In an embodiment, the lithographic parameter may comprise a characteristic of an illumination mode, such as a spatial intensity distribution characteristic. In an embodiment, the lithographic parameter may comprise a wavefront characteristic.

In an embodiment, the method may comprise receiving an image log slope (ILS) value for a set of different features in a pattern formed by an illumination source; and tuning a lithographic system parameter to optimize a bias between the ILS values of the different features to reduce LWR (e.g., LWR bias). In an embodiment, the method may comprise receiving a value of LWR and/or image log slope (ILS) for each feature of a plurality of different features of a pattern to be imaged, using a patterning device, onto a substrate in a lithographic process; and evaluating a cost function comprising a lithographic parameter and the values of LWR and/or ILS to determine a value of the lithographic parameter that (i) reduces a bias between the LWR and/or ILS of the different features, or (ii) reduces a difference in the LWR and/or ILS of the different features between different lithographic apparatuses, or (iii) reduces a difference in the LWR and/or ILS of the different features between different patterning devices, or (iv) any combination selected from (i)-(iii).

Figure 13:
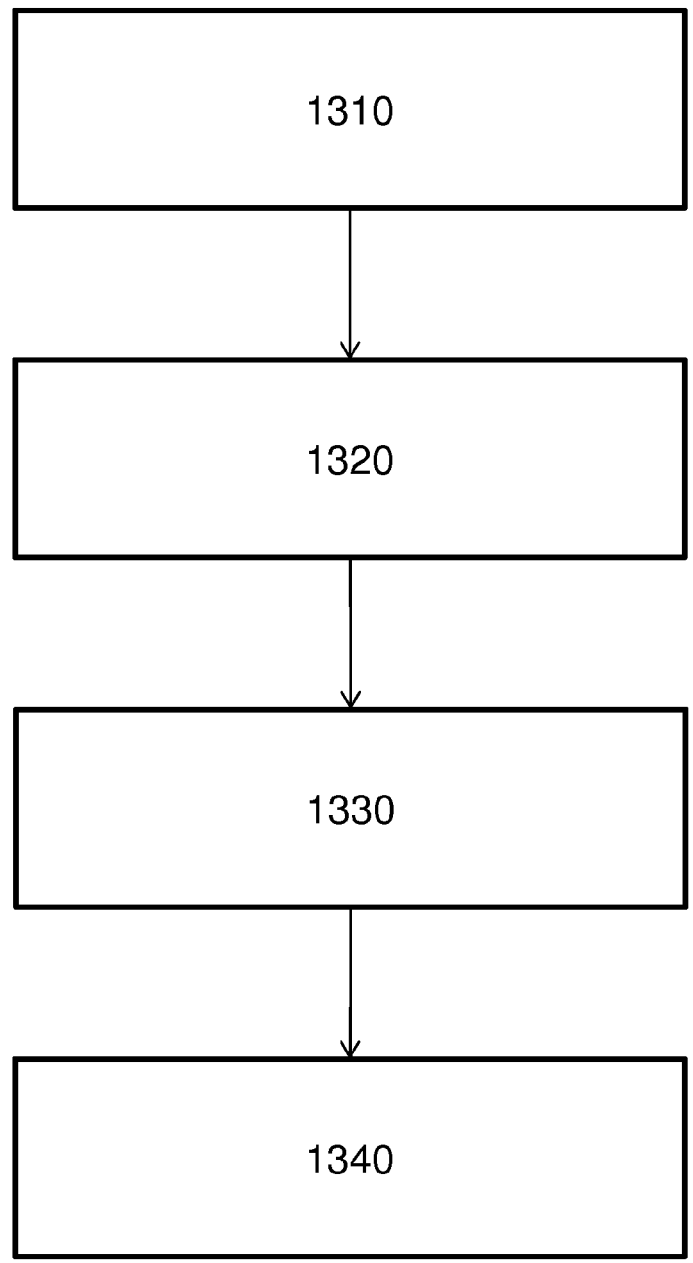
FIG. 13 schematically depicts a flow chart of a method of adjusting line-width roughness (LWR) in a lithographic system.

FIG. 13 illustrates an embodiment of a process for controlling line-width roughness in a lithography system. At block 1310, ILS or LWR for a set of features in a pattern at each of a plurality of evaluation points selected in an image plane is determined or received. At block 1320, a bias for the ILS or LWR is determined based on the difference between ILS or LWR for the different feature of the pattern, e.g., between ILS or LWR of horizontal features and ILS or LWR for vertical features. At block 1330, a value of a lithographic parameter may be determined that optimizes the bias such that, e.g., LWR (e.g. LWR bias) is reduced or the bias is matched (e.g., between lithographic apparatuses). This may be done by tuning the lithographic parameter to optimize the bias. For example, a cost function comprising the lithographic parameter and the values of LWR and/or ILS may be evaluated to determine a value of the lithographic parameter that (i) reduces a bias between the LWR and/or ILS of the different features, or (ii) reduces a difference in the LWR and/or ILS of the different features between different lithographic apparatuses, or (iii) reduces a difference in the LWR and/or ILS of the different features between different patterning devices, or (iv) any combination selected from (i)-(iii). In an embodiment, the lithographic parameter may comprise a characteristic of an illumination mode, such as a spatial intensity distribution characteristic. In an embodiment, the lithographic parameter may comprise a wavefront characteristic. At 1340, the lithographic parameter is applied, e.g., the target illumination mode and/or wavefront may be applied using the appropriate lithographic apparatus component.

As noted above, ILS or LWR for horizontal features and ILS or LWR for vertical features may be different at the overall ILS or LWR peak. This difference can be defined using a bias function. As discussed herein, this difference may be caused by variation in the shape of the spatial intensity distribution or by optical aberrations (e.g., caused by heating of various optical elements in the projection system during use). It is desirable to optimize the bias function (i.e., minimize the difference between ILS or LWR for horizontal features and ILS or LWR for vertical features) to reliably achieve feature geometry and improve process yield.

In sum, there is provided a technique to improve the yield of a manufacturing process by optimizing line-width roughness such that the difference between line-width roughness for horizontal dense features and line-width roughness for vertical dense features in a pattern is minimized. A significant problem in lithography of dense features is a difference between LWR for horizontal dense features and vertical features. Such differences can cause unreliability and inconsistent feature reproduction on the substrate, thereby causing failures in substrate acceptance tests. Such differences can be compensated during the process by suitably tuning the appropriate lithographic apparatus, e.g., the illumination mode and/or wavefront projected on the substrate.

As discussed above, one or more portions of the design layout may be identified, which are referred to as critical features or hot spots. In an embodiment, a set of critical features or hot spots is extracted, which represents the complicated patterns in the design layout (e.g., about 50 to 1000 critical features or hot spots, although any number of critical features or hot spots may be used). As will be appreciated by those skilled in the art, these critical features or hot spots represent small portions (i.e. circuits, cells or patterns) of the design and especially the critical features or hot spots represent small portions for which particular attention and/or verification is needed. The critical features or hot spots may be identified by experience (including critical features or hot spots provided by a user), by trial and error, or by running a full-chip simulation.

An embodiment of the invention may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

The invention may further be described using the following clauses:

1. A computer-implemented method to adjust line-width roughness (LWR) in a lithographic apparatus, the method comprising:

receiving a value of LWR and/or image log slope (ILS) for each feature of a plurality of different features of a pattern to be imaged, using a patterning device, onto a substrate in a lithographic process; and evaluating a cost function comprising a lithographic parameter and the values of LWR and/or ILS to determine a value of the lithographic parameter that (i) reduces a bias between the LWR and/or ILS of the different features, or (ii) reduces a difference in the LWR and/or ILS of the different features between different lithographic apparatuses, or (iii) reduces a difference in the LWR and/or ILS of the different features between different patterning devices, or (iv) any combination selected from (i)-(iii).

2. The computer-implemented method of clause 1, wherein the evaluating reduces a bias between the LWR and/or ILS of the different features.

3. The computer-implemented method of clause 1, wherein the evaluating reduces a difference in the LWR and/or ILS of the different features between different lithographic apparatuses.

4. The computer-implemented method of clause 1, wherein the evaluating reduces a difference in the LWR and/or ILS of the different features between different patterning devices.

5. The computer-implemented method of any of clauses 1 to 4, wherein the cost function further comprises critical dimension (CD) of the features and the evaluating reduces a difference of the CD to a target.

6. The computer-implemented method of any of clauses 1 to 5, wherein the lithographic parameter comprises an illumination mode of a radiation beam applied to the patterning device.

7. The computer-implemented method of clause 6, wherein the lithographic parameter comprises a spatial intensity distribution characteristic of the illumination mode.

8. The computer-implemented method of any of clauses 1 to 7, wherein the lithographic parameter comprises a wavefront characteristic.

9. The computer-implemented method of any of clauses 1 to 8, wherein the evaluated lithographic parameter comprises astigmatism.

10. The computer-implemented method of any of clauses 1 to 9, wherein the evaluated lithographic parameter comprises focus.

11. The computer-implemented method of any of clauses 1 to 10, comprising evaluating the cost function through the depth of focus of the lithographic process.

12. The computer-implemented method of any of clauses 1 to 11, wherein the different features are respectively a horizontal dense feature and a vertical dense feature.

13. A computer-implemented method to adjust line-width roughness (LWR) in a lithographic system, the method comprising:
receiving an image log slope (ILS) value for a set of different features in a pattern formed by an illumination source; and tuning a lithographic system parameter to optimize a bias between the ILS values of the different features to reduce LWR.

14. The computer-implemented method of clause 13, wherein the lithographic parameter comprises an illumination mode of a radiation beam applied to the patterning device.

15. The computer-implemented method of clause 14, wherein the lithographic parameter comprises a spatial intensity distribution characteristic of the illumination mode.

16. The computer-implemented method of clause 14 or clause 15, wherein tuning the lithographic parameter comprises adjusting a plurality of individually controllable elements in the beam path in an illumination system of the lithographic system.

17. The computer-implemented method of any of clauses 13 to 16, wherein the lithographic parameter comprises a wavefront characteristic.

18. The computer-implemented method of clause 17, wherein the wavefront characteristic comprises astigmatism.

19. The computer-implemented method of clause 17 or clause 18, wherein tuning the lithographic parameter comprises compensating for an optical aberration in an optical system of the lithographic system.

20. The computer-implemented method of any of clauses 17 to 19, wherein tuning the lithographic parameter comprises locally heating an optical element in the projection system.

21. The computer-implemented method of any of clauses 13 to 20, wherein the lithographic parameter comprises focus.

22. The computer-implemented method of clause 21, wherein tuning the lithographic parameter comprises adjusting a focus position at which the pattern is imaged on a substrate.

23. The computer-implemented method of any of clauses 13 to 22, wherein the different features comprises a set of horizontal features in the pattern and a set of vertical features in the pattern.

24. The computer-implemented method of any of clauses 13 to 23, further comprising determining the ILS for the set of features at each of a plurality of evaluation points selected in an image plane.

25. The computer-implemented method of any of clauses 13 to 24, comprising tuning the lithographic system parameter to optimize the bias between the ILS values of the different features to reduce LWR bias between the different features.

26. The computer-implemented method of any of clauses 13 to 25, wherein the different features are dense features.

27. A non-transitory data storage medium having a computer program stored therein to cause a process to perform a method of any of clauses 1 to 26.

Although specific reference may have been made above to the use of embodiments in the context of optical lithography, it will be appreciated that an embodiment of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further, although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

Where certain elements of these embodiments can be partially or fully implemented using known components, only those portions of such known components that are necessary for an understanding of the embodiments are described, and detailed descriptions of other portions of such known components are omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Further, the scope encompasses present and future known equivalents to the components referred to herein by way of illustration.

The term "optimizing" and "optimization" as used herein mean adjusting a lithographic projection apparatus or process such that results and/or processes of lithography have more desirable characteristics, such as higher accuracy of projection of design layouts on a substrate, larger process windows, etc.

A critical dimension (CD) can be defined as the smallest width of a line or hole or the smallest space between two lines or two holes; thus, the CD typically determines the overall size and density of the designed device.

The descriptions above are intended to be illustrative, not limiting. Thus, it will be apparent to one skilled in the art that modifications may be made to the invention as described without departing from the scope of the claims set out below. For example, one or more aspects of one or more embodiments may be combined with or substituted for one or more aspects of one or more other embodiments as appropriate. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance. The breadth and scope of the invention should not be limited by any of the above-described exemplary embodiments, but should be defined only in accordance with the following claims and their equivalents.

What is claimed is:

1. A method to adjust line-width roughness (LWR) in a lithographic apparatus, the method comprising:
   receiving a value of LWR and/or image log slope (ILS) for each feature of a plurality of different features of a pattern to be imaged, using a patterning device, onto a substrate in a lithographic process; and
   evaluating, by a hardware computer, a cost function comprising a lithographic parameter and the values of LWR and/or ILS to determine a value of the lithographic parameter that (i) reduces a bias between the LWR and/or ILS of the different features, or (ii) reduces a difference in the LWR and/or ILS of the different features between different lithographic apparatuses, or (iii) reduces a difference in the LWR and/or ILS of the different features between different patterning devices, or (iv) any combination selected from (i)-(iii); and
   providing electronic data, based on the determined lithographic parameter, for control of an operational parameter of the lithographic apparatus or process.

2. The method of claim 1, wherein the evaluating reduces a bias between the LWR and/or ILS of the different features.

3. The method of claim 1, wherein the cost function further comprises critical dimension (CD) of the different features and the evaluating reduces a difference of the critical dimension (CD) to a target.

4. The method of claim 1, wherein the lithographic parameter comprises an illumination mode of a radiation beam applied to the patterning device, or wherein the lithographic parameter comprises a spatial intensity distribution characteristic of the illumination mode.

5. The method of claim 1, wherein the lithographic parameter comprises a wavefront characteristic.

6. The method of claim 1, wherein the evaluated lithographic parameter comprises astigmatism, or wherein the evaluated lithographic parameter comprises focus.

7. The method of claim 1, comprising evaluating the cost function through depth of focus of the lithographic process.

8. The method of claim 1, wherein the evaluating reduces a difference in the LWR and/or ILS of the different features between different lithographic apparatuses.

9. The method of claim 1, wherein the evaluating reduces a difference in the LWR and/or ILS of the different features between different patterning devices.

10. A method to adjust line-width roughness (LWR) in a lithographic system, the method comprising:
    receiving an image log slope (ILS) value for each of a plurality of different features in a pattern formed by an illumination radiation beam; and
    tuning, by a hardware computer, a lithographic system parameter to optimize a bias between the image log slope (ILS) values of the different features to reduce line-width roughness (LWR).

11. The method of claim 10, wherein the lithographic system parameter comprises an illumination mode of the illumination radiation beam applied to the patterning device, or wherein the lithographic system parameter comprises a spatial intensity distribution characteristic of the illumination mode.

12. The method of claim 11, wherein tuning the lithographic system parameter comprises adjusting a plurality of individually controllable elements in a path of the illumination radiation beam in an illumination system of the lithographic system.

13. The method of claim 10, wherein the lithographic system parameter comprises a wavefront characteristic.

14. The method of claim 13, wherein tuning the lithographic system parameter comprises compensating for an optical aberration in an optical system of the lithographic system, or wherein tuning the lithographic system parameter comprises locally heating an optical element in the projection system.

15. The method of claim 10, wherein the lithographic system parameter comprises focus, and wherein tuning the lithographic system parameter comprises adjusting a focus position at which the pattern is imaged on a substrate.

16. The method of claim 10, further comprising determining the ILS for the plurality of different features at each of a plurality of evaluation points selected in an image plane.

17. A non-transitory data storage medium having a computer program stored therein, the computer program configured to cause a processor to:
    receive a value of line-width roughness (LWR) and/or image log slope (ILS) for each feature of a plurality of different features of a pattern to be imaged, using a patterning device in a lithographic apparatus, onto a substrate in a lithographic process; and
    evaluate a cost function comprising a lithographic parameter and the values of LWR and/or ILS to determine a value of the lithographic parameter that (i) reduces a bias between the LWR and/or ILS of the different features, or (ii) reduces a difference in the LWR and/or ILS of the different features between different lithographic apparatuses, or (iii) reduces a difference in the LWR and/or ILS of the different features between different patterning devices, or (iv) any combination selected from (i)-(iii); and
    providing electronic data, based on the evaluated lithographic parameter, for control of an operational parameter of the lithographic apparatus or process.

18. The data storage medium of claim 17, wherein the computer program is configured to cause a processor to evaluate the cost function to reduce a bias between the LWR and/or ILS of the different features.

19. The data storage medium of claim 17, wherein the cost function further comprises critical dimension (CD) of the different features and the computer program is configured to cause a processor to evaluate the cost function to reduce a difference of the critical dimension (CD) to a target.

20. The data storage medium of claim 17, wherein the lithographic parameter comprises an illumination mode of a radiation beam applied to the patterning device, or wherein the lithographic parameter comprises a spatial intensity distribution characteristic of the illumination mode.

* * * * *